United States Patent
Henzler et al.

(10) Patent No.: US 12,034,409 B2
(45) Date of Patent: Jul. 9, 2024

(54) RADIO-FREQUENCY AMPLIFIER WITH LOAD RESPONSE ESTIMATION

(71) Applicant: Apple Inc., Cupertino, CA (US)

(72) Inventors: Stephan Henzler, Munich (DE); Andreas Langer, Munich (DE)

(73) Assignee: Apple Inc., Cupertino, CA (US)

( * ) Notice: Subject to any disclaimer, the term of this patent is extended or adjusted under 35 U.S.C. 154(b) by 35 days.

(21) Appl. No.: 18/159,604

(22) Filed: Jan. 25, 2023

(65) Prior Publication Data

US 2023/0353098 A1    Nov. 2, 2023

Related U.S. Application Data

(60) Provisional application No. 63/336,976, filed on Apr. 29, 2022.

(51) Int. Cl.
| | |
|---|---|
| *H04B 1/38* | (2015.01) |
| *H03F 1/02* | (2006.01) |
| *H03F 3/21* | (2006.01) |
| *H04B 1/04* | (2006.01) |

(52) U.S. Cl.
CPC .......... *H03F 1/0288* (2013.01); *H03F 3/211* (2013.01); *H04B 1/0475* (2013.01); *H03F 2200/451* (2013.01); *H04B 2001/0416* (2013.01)

(58) Field of Classification Search
CPC .. H03F 1/0288; H03F 3/211; H03F 2200/451; H04B 1/0475; H04B 2001/0416

USPC ........................................ 375/219, 295, 316
See application file for complete search history.

(56) References Cited

U.S. PATENT DOCUMENTS

| | | | |
|---|---|---|---|
| 7,151,405 B2 | 12/2006 | Nezami | |
| 9,026,391 B2 | 5/2015 | Sogl et al. | |
| 9,705,477 B2 | 7/2017 | Velazquez | |
| 2003/0184374 A1 | 10/2003 | Huang et al. | |
| 2005/0032472 A1 | 2/2005 | Jiang et al. | |
| 2010/0062813 A1* | 3/2010 | Kujanski | H03F 1/32 |
| | | | 455/127.5 |
| 2011/0121899 A1 | 5/2011 | Kawai | |
| 2014/0269989 A1 | 9/2014 | Santucci et al. | |

* cited by examiner

*Primary Examiner* — Zewdu A Kassa
(74) *Attorney, Agent, or Firm* — Treyz Law Group; Jason Tsai (57) ABSTRACT

An electronic device may include wireless circuitry with a processor that generates baseband signals, an upconversion circuit that upconverts the baseband signals to radio-frequency signals, a power amplifier, an antenna, and a transmit filter with a frequency dependent filter response coupled between the output of the power amplifier and the antenna. To help mitigate the frequency dependent filter response, the wireless circuitry may further include predistortion circuitry having an amplifier load response estimator that implements a baseband model of the filter response, an amplifier non-linearity estimator that models the non-linear behavior of the amplifier, and a control signal generator for adjusting the power amplifier based on the output of the amplifier load response estimator and the amplifier non-linearity estimator.

20 Claims, 8 Drawing Sheets

RADIO-FREQUENCY AMPLIFIER WITH LOAD RESPONSE ESTIMATION

This application claims the benefit of U.S. Provisional Patent Application No. 63/336,976, filed Apr. 29, 2022, which is hereby incorporated by reference herein in its entirety.

FIELD

This disclosure relates generally to electronic devices and, more particularly, to electronic devices with wireless communications circuitry.

BACKGROUND

Electronic devices are often provided with wireless communications capabilities. An electronic device with wireless communications capabilities has wireless communications circuitry with one or more antennas. Wireless transceiver circuitry in the wireless communications circuitry uses the antennas to transmit and receive radio-frequency signals.

Radio-frequency signals transmitted by an antenna are often fed through one or more power amplifiers, which are configured to amplify low power analog signals to higher power signals more suitable for transmission through the air over long distances. It can be challenging to design a satisfactory power amplifier for an electronic device.

SUMMARY

An electronic device may include wireless communications circuitry. The wireless communications circuitry may include one or more processors or signal processing blocks for generating baseband signals, a transceiver for receiving the digital signals and for generating corresponding radio-frequency signals, and one or more radio-frequency power amplifiers configured to amplify the radio-frequency signals for transmission by one or more antennas in the electronic device. The power amplifier may have a frequency dependent load coupled at its output. The frequency dependent load may be the input impedance of a high-Q radio-frequency bandpass filter.

To ensure that the power amplifier is kept in constant compression, predistortion circuitry can be used to predistort baseband signals and to generate a control (compensation) signal for adjusting the power amplifier. The predistortion circuitry may include an amplifier load response estimator, a non-linearity estimator, and a control signal generator. The amplifier load response estimator may implement a complex baseband model of the frequency dependent load to output an estimated load response. The non-linearity estimator may model non-linear behavior(s) associated with the amplifier to output estimated amplifier non-linearity information and may model non-linear effects of the frequency dependent load. The control signal generator may generate the control signal based on the estimated load response and/or the estimated amplifier non-linearity information. Configured and operated in this way, the peak voltage swing at the amplifier can be kept constant to maintain compression and iso-gain operation while providing improved linearity. The goal of constant compression and iso-gain operation is merely illustrative. If desired, other gain profiles can also be achieved using control signals generated using one or more paths in the predistortion circuitry.

An aspect of the disclosure provides wireless circuitry that includes: a frequency upconversion circuit having an input configured to receive baseband signals and having an output on which corresponding radio-frequency signals are generated; an amplifier having an input configured to receive the radio-frequency signals from the output of the frequency upconversion circuit, an output coupled to an antenna, and a control input; a load response estimator having an input configured to receive signals generated based on the baseband signals and having an output on which an estimated load response is generated, the load response estimator implementing a baseband model derived from a frequency dependent load impedance seen at the output of the amplifier; and a control signal generator having an input configured to receive the estimated load response from the output of the load response estimator and having an output coupled to the control input of amplifier. The control signal generator can include: an absolute value function generator having an input configured to receive the estimated load response from the output of the load response estimator and having an output; and an envelope tracking power management circuit having an input coupled to the output of the absolute value function generator and having an output coupled to the control input of the amplifier. An adjustable power supply voltage can be provided to the control input of the amplifier using the envelope tracking power management circuit. The wireless circuitry can further include an amplifier non-linearity estimator configured to generate amplifier non-linearity information. The amplifier non-linearity estimator can be coupled to the input or to the output of the load response estimator. The control signal can be used to adjust an impedance coupled to a coupling circuit at the output of the amplifier or to adjust a radio-frequency coupler disposed at the output of the amplifier. The load response estimator, the control signal generator, and/or the non-linearity estimator can run on, be executed on, or be implemented using processing circuitry.

An aspect of the disclosure provides a method of operating wireless circuitry that includes: upconverting baseband signals to radio-frequency signals; using an amplifier to receive and amplify the radio-frequency signals, the amplifier having an output coupled to a frequency dependent load; using an amplifier load response estimator to generate an estimated amplifier load response based on the baseband signals, the amplifier load response estimator implementing a dynamic baseband model derived based on the frequency dependent load; and using a control signal generator to generate a control signal for the amplifier based on the estimated amplifier load response. The control signal can be an adjustable power supply voltage, an adjustable bias voltage for the amplifier, a load modulation control signal for the amplifier, or an input of an auxiliary power amplifier coupled to the main power amplifier. The method can include using an amplifier non-linearity estimator to generate amplifier non-linearity information that is used by the control signal generator to generate the control signal.

An aspect of the disclosure provides an electronic device that includes one or more processors configured to generate baseband signals, an upconverter configured to upconvert the baseband signals to radio-frequency signals, an amplifier having an input configured to receive the radio-frequency signals from the output of the upconverter and having an output, a bandpass filter coupled at the output of the amplifier, the bandpass filter having a frequency dependent input impedance, and predistortion circuitry configured to receive the baseband signals, to predistort the baseband signals using a baseband model that resembles or approximates the frequency dependent input impedance of the bandpass filter, and to generate a corresponding control signal for adjusting the amplifier. The predistortion circuitry can include a load response estimator implementing the baseband model and an amplifier non-linearity estimator configured to model a non-linear behavior associated with the amplifier. The control signal can be an adjustable power supply voltage for the amplifier, an adjustable bias voltage for the amplifier, an input signal to an auxiliary amplifier, and a load modulation control signal for the amplifier. The predistortion circuitry can include an envelope generator configured to generate the control signal for adjusting the amplifier.

DETAILED DESCRIPTION

Figure 1:
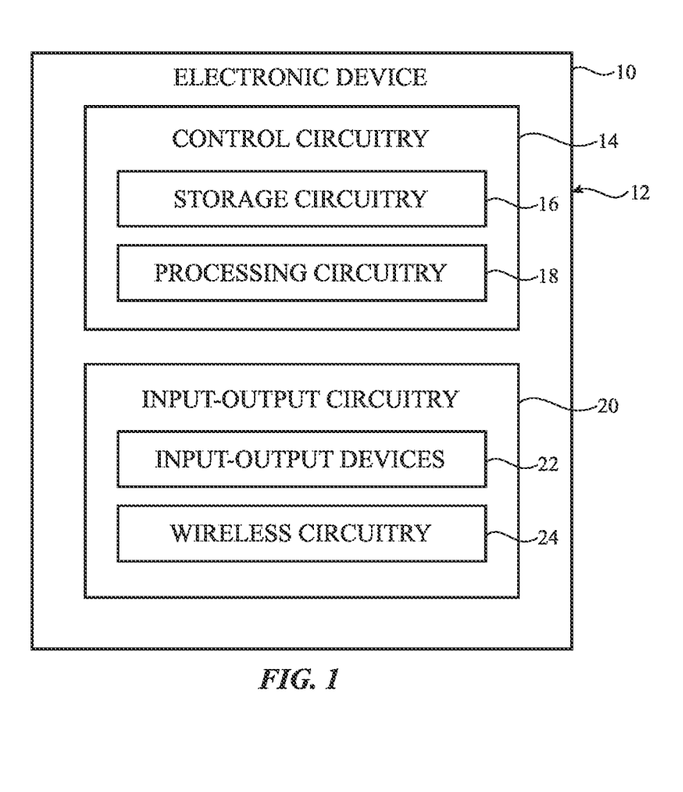
FIG. 1 is a diagram of an illustrative electronic device having wireless circuitry in accordance with some embodiments.

An electronic device such as device 10 of FIG. 1 may be provided with wireless circuitry. The wireless circuitry may include a processor for generating baseband signals, an upconversion circuit for upconverting (mixing) the baseband signals into radio-frequency signals, an amplifier for amplifying the radio-frequency signals, an antenna for radiating the amplified radio-frequency signals, and a load that is coupled at the output of the amplifier.

In certain applications, the load may present a frequency dependent input impedance at the output of the amplifier. To ensure that the amplifier can operate properly over a range of radio frequencies in the presence of such varying load impedance, the wireless circuitry may be provided with predistortion circuitry that models the frequency dependent input impedance of the load and predistorts the baseband signals. The predistortion circuitry can include an amplifier load response estimator that estimates or models the frequency dependent behavior associated with the load, an optional non-linearity estimator that estimates or models any non-linear behavior associated with the amplifier and the frequency dependent load, and a control signal generator for outputting a control signal to tune the amplifier. Configured and operated in this way, the amplifier can be kept in constant compression and exhibits improved linearity.

Electronic device 10 of FIG. 1 may be a computing device such as a laptop computer, a desktop computer, a computer monitor containing an embedded computer, a tablet computer, a cellular telephone, a media player, or other handheld or portable electronic device, a smaller device such as a wristwatch device, a pendant device, a headphone or earpiece device, a device embedded in eyeglasses or other equipment worn on a user's head, or other wearable or miniature device, a television, a computer display that does not contain an embedded computer, a gaming device, a navigation device, an embedded system such as a system in which electronic equipment with a display is mounted in a kiosk or automobile, a wireless internet-connected voice-controlled speaker, a home entertainment device, a remote control device, a gaming controller, a peripheral user input device, a wireless base station or access point, equipment that implements the functionality of two or more of these devices, or other electronic equipment.

As shown in the functional block diagram of FIG. 1, device 10 may include components located on or within an electronic device housing such as housing 12. Housing 12, which may sometimes be referred to as a case, may be formed from plastic, glass, ceramics, fiber composites, metal (e.g., stainless steel, aluminum, metal alloys, etc.), other suitable materials, or a combination of these materials. In some embodiments, parts or all of housing 12 may be formed from dielectric or other low-conductivity material (e.g., glass, ceramic, plastic, sapphire, etc.). In other embodiments, housing 12 or at least some of the structures that make up housing 12 may be formed from metal elements.

Device 10 may include control circuitry 14. Control circuitry 14 may include storage such as storage circuitry 16. Storage circuitry 16 may include hard disk drive storage, nonvolatile memory (e.g., flash memory or other electrically-programmable-read-only memory configured to form a solid-state drive), volatile memory (e.g., static or dynamic random-access-memory), etc. Storage circuitry 16 may include storage that is integrated within device 10 and/or removable storage media.

Control circuitry 14 may include processing circuitry such as processing circuitry 18. Processing circuitry 18 may be used to control the operation of device 10. Processing circuitry 18 may include on one or more microprocessors, microcontrollers, digital signal processors, host processors, baseband processor integrated circuits, application specific integrated circuits, central processing units (CPUs), etc. Control circuitry 14 may be configured to perform operations in device 10 using hardware (e.g., dedicated hardware or circuitry), firmware, and/or software. Software code for performing operations in device 10 may be stored on storage circuitry 16 (e.g., storage circuitry 16 may include non-transitory (tangible) computer readable storage media that stores the software code). The software code may sometimes be referred to as program instructions, software, data, instructions, or code. Software code stored on storage circuitry 16 may be executed by processing circuitry 18.

Control circuitry 14 may be used to run software on device 10 such as satellite navigation applications, internet browsing applications, voice-over-internet-protocol (VOIP) telephone call applications, email applications, media playback applications, operating system functions, etc. To support interactions with external equipment, control circuitry 14 may be used in implementing communications protocols. Communications protocols that may be implemented using control circuitry 14 include internet protocols, wireless local area network (WLAN) protocols (e.g., IEEE 802.11 protocols—sometimes referred to as Wi-Fi®), protocols for other short-range wireless communications links such as the Bluetooth® protocol or other wireless personal area network (WPAN) protocols, IEEE 802.11ad protocols (e.g., ultra-wideband protocols), cellular telephone protocols (e.g., 3G protocols, 4G (LTE) protocols, 5G protocols, etc.), antenna diversity protocols, satellite navigation system protocols (e.g., global positioning system (GPS) protocols, global navigation satellite system (GLONASS) protocols, etc.), antenna-based spatial ranging protocols (e.g., radio detection and ranging (RADAR) protocols or other desired range detection protocols for signals conveyed at millimeter and centimeter wave frequencies), or any other desired communications protocols. Each communications protocol may be associated with a corresponding radio access technology (RAT) that specifies the physical connection methodology used in implementing the protocol.

Device 10 may include input-output circuitry 20. Input-output circuitry 20 may include input-output devices 22. Input-output devices 22 may be used to allow data to be supplied to device 10 and to allow data to be provided from device 10 to external devices. Input-output devices 22 may include user interface devices, data port devices, and other input-output components. For example, input-output devices 22 may include touch sensors, displays (e.g., touch-sensitive and/or force-sensitive displays), light-emitting components such as displays without touch sensor capabilities, buttons (mechanical, capacitive, optical, etc.), scrolling wheels, touch pads, key pads, keyboards, microphones, cameras, buttons, speakers, status indicators, audio jacks and other audio port components, digital data port devices, motion sensors (accelerometers, gyroscopes, and/or compasses that detect motion), capacitance sensors, proximity sensors, magnetic sensors, force sensors (e.g., force sensors coupled to a display to detect pressure applied to the display), etc. In some configurations, keyboards, headphones, displays, pointing devices such as trackpads, mice, and joysticks, and other input-output devices may be coupled to device 10 using wired or wireless connections (e.g., some of input-output devices 22 may be peripherals that are coupled to a main processing unit or other portion of device 10 via a wired or wireless link).

Input-output circuitry 20 may include wireless circuitry 24 to support wireless communications. Wireless circuitry 24 (sometimes referred to herein as wireless communications circuitry 24) may include one or more antennas. Wireless circuitry 24 may also include baseband processor circuitry, transceiver circuitry, amplifier circuitry, filter circuitry, switching circuitry, radio-frequency transmission lines, and/or any other circuitry for transmitting and/or receiving radio-frequency signals using the antenna(s).

Wireless circuitry 24 may transmit and/or receive radio-frequency signals within a corresponding frequency band at radio frequencies (sometimes referred to herein as a communications band or simply as a "band"). The frequency bands handled by wireless circuitry 24 may include wireless local area network (WLAN) frequency bands (e.g., Wi-Fi® (IEEE 802.11) or other WLAN communications bands) such as a 2.4 GHz WLAN band (e.g., from 2400 to 2480 MHz), a 5 GHz WLAN band (e.g., from 5180 to 5825 MHz), a Wi-Fi® 6E band (e.g., from 5925-7125 MHz), and/or other Wi-Fi® bands (e.g., from 1875-5160 MHz), wireless personal area network (WPAN) frequency bands such as the 2.4 GHz Bluetooth® band or other WPAN communications bands, cellular telephone frequency bands (e.g., bands from about 600 MHz to about 5 GHz, 3G bands, 4G LTE bands, 5G New Radio Frequency Range 1 (FR1) bands below 10 GHz, 5G New Radio Frequency Range 2 (FR2) bands between 20 and 60 GHz, etc.), other centimeter or millimeter wave frequency bands between 10-300 GHz, near-field communications frequency bands (e.g., at 13.56 MHz), satellite navigation frequency bands (e.g., a GPS band from 1565 to 1610 MHz, a Global Navigation Satellite System (GLONASS) band, a BeiDou Navigation Satellite System (BDS) band, etc.), ultra-wideband (UWB) frequency bands that operate under the IEEE 802.15.4 protocol and/or other ultra-wideband communications protocols, communications bands under the family of 3GPP wireless communications standards, communications bands under the IEEE 802.XX family of standards, and/or any other desired frequency bands of interest.

Figure 2:
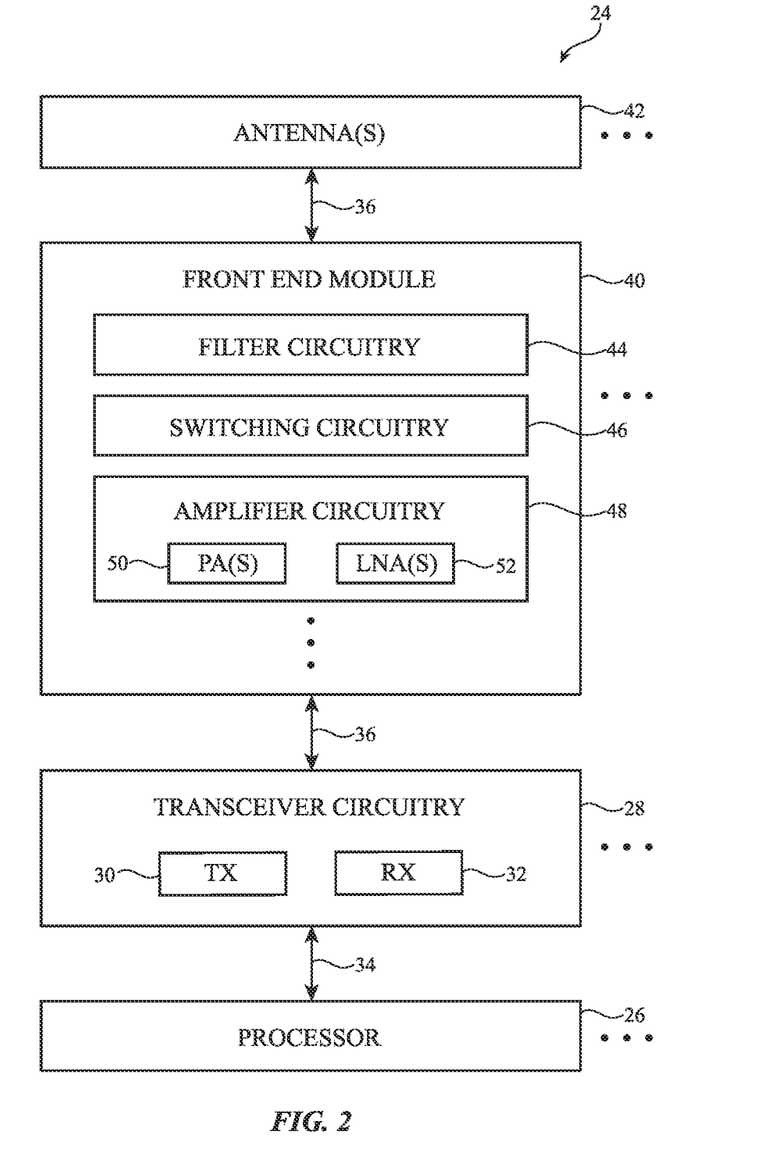
FIG. 2 is a diagram of illustrative wireless circuitry having amplifiers in accordance with some embodiments.

FIG. 2 is a diagram showing illustrative components within wireless circuitry 24. As shown in FIG. 2, wireless circuitry 24 may include a processor such as processor 26, radio-frequency (RF) transceiver circuitry such as radio-frequency transceiver 28, radio-frequency front end circuitry such as radio-frequency front end module (FEM) 40, and antenna(s) 42. Processor 26 may be a baseband processor, application processor, general purpose processor, microprocessor, microcontroller, digital signal processor, host processor, application specific signal processing hardware, or other type of processor. Processor 26 may be coupled to transceiver 28 over path 34. Transceiver 28 may be coupled to antenna 42 via radio-frequency transmission line path 36. Radio-frequency front end module 40 may be disposed on radio-frequency transmission line path 36 between transceiver 28 and antenna 42.

In the example of FIG. 2, wireless circuitry 24 is illustrated as including only a single processor 26, a single transceiver 28, a single front end module 40, and a single antenna 42 for the sake of clarity. In general, wireless circuitry 24 may include any desired number of processors 26, any desired number of transceivers 28, any desired number of front end modules 40, and any desired number of antennas 42. Each processor 26 may be coupled to one or more transceiver 28 over respective paths 34. Each transceiver 28 may include a transmitter circuit 30 configured to output uplink signals to antenna 42, may include a receiver circuit 32 configured to receive downlink signals from antenna 42, and may be coupled to one or more antennas 42 over respective radio-frequency transmission line paths 36. Each radio-frequency transmission line path 36 may have a respective front end module 40 disposed thereon. If desired, two or more front end modules 40 may be disposed on the same radio-frequency transmission line path 36. If desired, one or more of the radio-frequency transmission line paths 36 in wireless circuitry 24 may be implemented without any front end module disposed thereon.

Radio-frequency transmission line path 36 may be coupled to an antenna feed on antenna 42. The antenna feed may, for example, include a positive antenna feed terminal and a ground antenna feed terminal. Radio-frequency transmission line path 36 may have a positive transmission line signal path such that is coupled to the positive antenna feed terminal on antenna 42. Radio-frequency transmission line path 36 may have a ground transmission line signal path that is coupled to the ground antenna feed terminal on antenna 42. This example is merely illustrative and, in general, antennas 42 may be fed using any desired antenna feeding scheme. If desired, antenna 42 may have multiple antenna feeds that are coupled to one or more radio-frequency transmission line paths 36.

Radio-frequency transmission line path 36 may include transmission lines that are used to route radio-frequency antenna signals within device 10 (FIG. 1). Transmission lines in device 10 may include coaxial cables, microstrip transmission lines, stripline transmission lines, edge-coupled microstrip transmission lines, edge-coupled stripline transmission lines, transmission lines formed from combinations of transmission lines of these types, etc. Transmission lines in device 10 such as transmission lines in radio-frequency transmission line path 36 may be integrated into rigid and/or flexible printed circuit boards.

In performing wireless transmission, processor 26 may provide transmit signals (e.g., digital or baseband signals) to transceiver 28 over path 34. Transceiver 28 may further include circuitry for converting the transmit (baseband) signals received from processor 26 into corresponding radio-frequency signals. For example, transceiver circuitry 28 may include mixer circuitry for up-converting (or modulating) the transmit (baseband) signals to radio frequencies prior to transmission over antenna 42. The example of FIG. 2 in which processor 26 communicates with transceiver 28 is merely illustrative. In general, transceiver 28 may communicate with a baseband processor, an application processor, general purpose processor, a microcontroller, a microprocessor, or one or more processors within circuitry 18. Transceiver circuitry 28 may also include digital-to-analog converter (DAC) and/or analog-to-digital converter (ADC) circuitry for converting signals between digital and analog domains. Transceiver 28 may use transmitter (TX) 30 to transmit the radio-frequency signals over antenna 42 via radio-frequency transmission line path 36 and front end module 40. Antenna 42 may transmit the radio-frequency signals to external wireless equipment by radiating the radio-frequency signals into free space.

In performing wireless reception, antenna 42 may receive radio-frequency signals from the external wireless equipment. The received radio-frequency signals may be conveyed to transceiver 28 via radio-frequency transmission line path 36 and front end module 40. Transceiver 28 may include circuitry such as receiver (RX) 32 for receiving signals from front end module 40 and for converting the received radio-frequency signals into corresponding baseband signals. For example, transceiver 28 may include mixer circuitry for down-converting (or demodulating) the received radio-frequency signals to baseband frequencies prior to conveying the received signals to processor 26 over path 34.

Front end module (FEM) 40 may include radio-frequency front end circuitry that operates on the radio-frequency signals conveyed (transmitted and/or received) over radio-frequency transmission line path 36. FEM 40 may, for example, include front end module (FEM) components such as radio-frequency filter circuitry 44 (e.g., low pass filters, high pass filters, notch filters, band pass filters, multiplexing circuitry, duplexer circuitry, diplexer circuitry, triplexer circuitry, etc.), switching circuitry 46 (e.g., one or more radio-frequency switches), radio-frequency amplifier circuitry 48 (e.g., one or more power amplifier circuits 50 and/or one or more low-noise amplifier circuits 52), impedance matching circuitry (e.g., circuitry that helps to match the impedance of antenna 42 to the impedance of radio-frequency transmission line 36), antenna tuning circuitry (e.g., networks of capacitors, resistors, inductors, and/or switches that adjust the frequency response of antenna 42), radio-frequency coupler circuitry, charge pump circuitry, power management circuitry, digital control and interface circuitry, and/or any other desired circuitry that operates on the radio-frequency signals transmitted and/or received by antenna 42. Each of the front end module components may be mounted to a common (shared) substrate such as a rigid printed circuit board substrate or flexible printed circuit substrate. If desired, the various front end module components may also be integrated into a single integrated circuit chip. If desired, amplifier circuitry 48 and/or other components in front end 40 such as filter circuitry 44 may also be implemented as part of transceiver circuitry 28.

Filter circuitry 44, switching circuitry 46, amplifier circuitry 48, and other circuitry may be disposed along radio-frequency transmission line path 36, may be incorporated into FEM 40, and/or may be incorporated into antenna 42 (e.g., to support antenna tuning, to support operation in desired frequency bands, etc.). These components, sometimes referred to herein as antenna tuning components, may be adjusted (e.g., using control circuitry 14) to adjust the frequency response and wireless performance of antenna 42 over time.

Transceiver 28 may be separate from front end module 40. For example, transceiver 28 may be formed on another substrate such as the main logic board of device 10, a rigid printed circuit board, or flexible printed circuit that is not a part of front end module 40. While control circuitry 14 is shown separately from wireless circuitry 24 in the example of FIG. 1 for the sake of clarity, wireless circuitry 24 may include processing circuitry that forms a part of processing circuitry 18 and/or storage circuitry that forms a part of storage circuitry 16 of control circuitry 14 (e.g., portions of control circuitry 14 may be implemented on wireless circuitry 24). As an example, processor 26 and/or portions of transceiver 28 (e.g., a host processor on transceiver 28) may form a part of control circuitry 14. Control circuitry 14 (e.g., portions of control circuitry 14 formed on processor 26, portions of control circuitry 14 formed on transceiver 28, and/or portions of control circuitry 14 that are separate from wireless circuitry 24) may provide control signals (e.g., over one or more control paths in device 10) that control the operation of front end module 40.

Transceiver circuitry 28 may include wireless local area network transceiver circuitry that handles WLAN communications bands (e.g., Wi-Fi® (IEEE 802.11) or other WLAN communications bands) such as a 2.4 GHz WLAN band (e.g., from 2400 to 2480 MHz), a 5 GHz WLAN band (e.g., from 5180 to 5825 MHz), a Wi-Fi® 6E band (e.g., from 5925-7125 MHz), and/or other Wi-Fi® bands (e.g., from 1875-5160 MHz), wireless personal area network transceiver circuitry that handles the 2.4 GHz Bluetooth® band or other WPAN communications bands, cellular telephone transceiver circuitry that handles cellular telephone bands (e.g., bands from about 600 MHz to about 5 GHz, 3G bands, 4G LTE bands, 5G New Radio Frequency Range 1 (FR1) bands below 10 GHz, 5G New Radio Frequency Range 2 (FR2) bands between 20 and 60 GHz, etc.), near-field communications (NFC) transceiver circuitry that handles near-field communications bands (e.g., at 13.56 MHz), satellite navigation receiver circuitry that handles satellite navigation bands (e.g., a GPS band from 1565 to 1610 MHz, a Global Navigation Satellite System (GLONASS) band, a BeiDou Navigation Satellite System (BDS) band, etc.), ultra-wideband (UWB) transceiver circuitry that handles communications using the IEEE 802.15.4 protocol and/or other ultra-wideband communications protocols, and/or any other desired radio-frequency transceiver circuitry for covering any other desired communications bands of interest.

Wireless circuitry 24 may include one or more antennas such as antenna 42. Antenna 42 may be formed using any desired antenna structures. For example, antenna 42 may be an antenna with a resonating element that is formed from loop antenna structures, patch antenna structures, inverted-F antenna structures, slot antenna structures, planar inverted-F antenna structures, helical antenna structures, monopole antennas, dipoles, hybrids of these designs, etc. Two or more antennas 42 may be arranged into one or more phased antenna arrays (e.g., for conveying radio-frequency signals at millimeter wave frequencies). Parasitic elements may be included in antenna 42 to adjust antenna performance. Antenna 42 may be provided with a conductive cavity that backs the antenna resonating element of antenna 42 (e.g., antenna 42 may be a cavity-backed antenna such as a cavity-backed slot antenna).

As described above, front end module 40 may include one or more power amplifiers (PA) circuits 50 in the transmit (uplink) path. A power amplifier 50 (sometimes referred to as radio-frequency power amplifier, transmit amplifier, or amplifier) may be configured to amplify a radio-frequency signal without changing the signal shape, format, or modulation. Amplifier 50 may, for example, be used to provide 10 dB of gain, 20 dB of gain, 10-20 dB of gain, less than 20 dB of gain, more than 20 dB of gain, or other suitable amounts of gain.

It can be challenging to design a satisfactory radio-frequency power amplifier for an electronic device. In general, a radio-frequency amplifier is most efficient when it is operating in compression (i.e., when an increase in the input power results in a non-linear change in output power of the amplifier, which typically occurs at the higher range of input power levels). Conventional radio-frequency power amplifiers that receive a fixed power supply voltage will become less efficient when the amplifier operates at lower input power levels.

In an effort to address this reduction in efficiency, an envelope tracking technique has been developed where the power supply voltage of the radio-frequency power amplifier is continuously adjusted such that the gain of the power amplifier remains constant over varying signal amplitudes (sometimes referred to as iso-gain operation). Other gain shaping strategies e.g. iso-compression operation, pre-defined gain-over-power characteristic, etc are possible as well. A conventional implementation of the envelope tracking system generates a variable power supply voltage using a static linear transformation of the absolute value of a baseband signal from which the radio-frequency signals are generated. Such static mapping of the absolute value of the baseband signal to the amplifier power supply voltage ensures for instance iso-gain operation only if the load at the output of the power amplifier is frequency independent (i.e., if the amplifier load impedance is constant). In practice, however, the load impedance at the output of the power amplifier is frequency dependent, so iso-gain operation is at best only approximately attained. Iso-gain operation may be desirable but is not necessary. Any tracking error resulting for such approximation limits the maximum achievable envelope tracking frequency.

Figure 3:
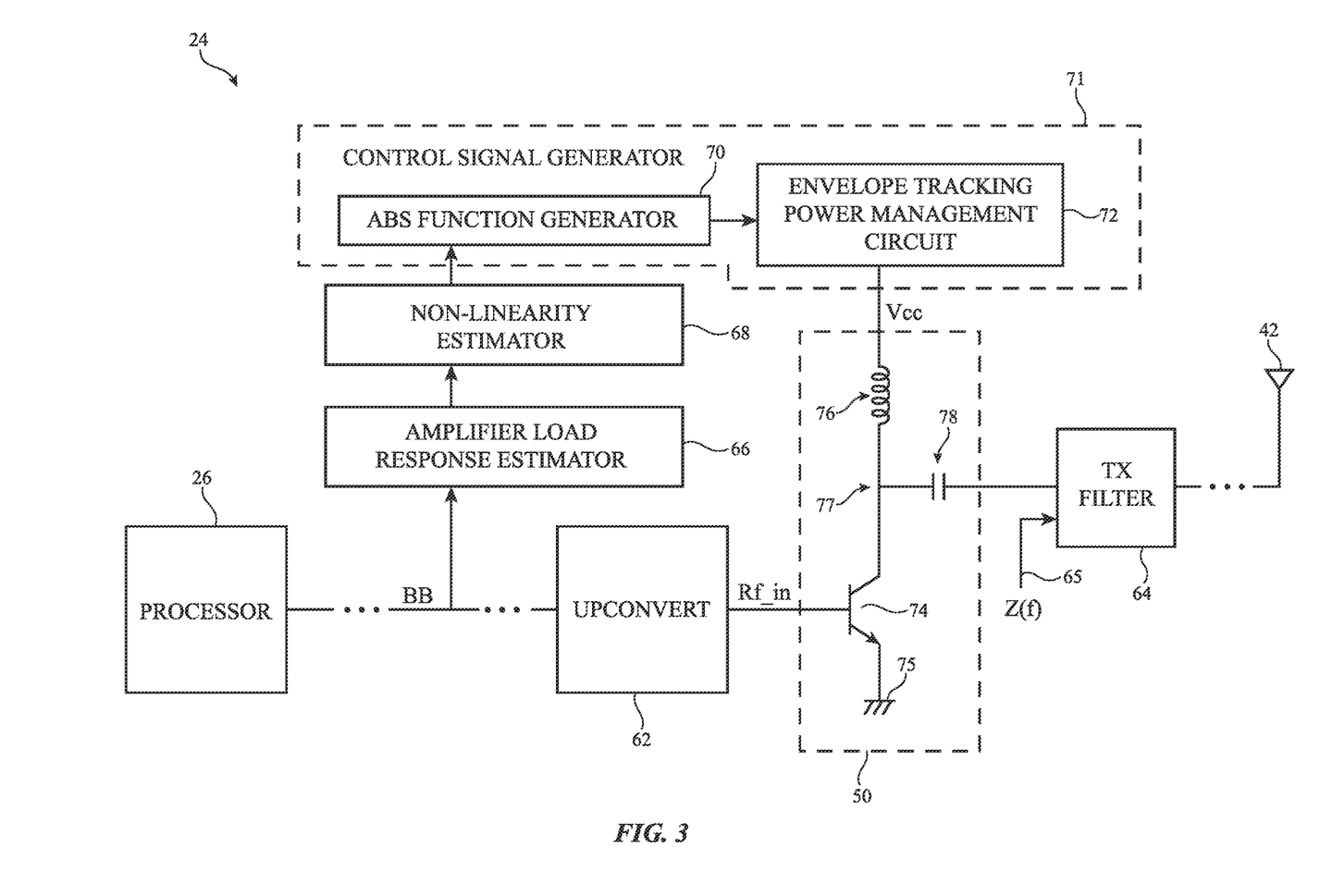
FIG. 3 is a diagram of illustrative wireless circuitry having envelope tracking predistortion circuitry configured to generate a variable power supply voltage for an amplifier in accordance with some embodiments.

In accordance with an embodiment, wireless circuitry 24 of FIG. 3 is provided with predistortion circuitry configured to generate a frequency dependent control signal for adjusting the amplifier, thus attaining more accurate tracking for gain shaping strategy (e.g., iso-gain operation) while reducing non-linear distortion and enabling higher bandwidth operation. As shown in FIG. 3, wireless circuitry 24 may include processor 26 configured to generate baseband signals, an upconversion circuit such as upconverter 62, a radio-frequency power amplifier such as amplifier 50, a filtering circuit such as transmit filter 64 coupled to the output of amplifier 50, and an antenna 52 configured to radiate radio-frequency signals output from amplifier 50 via transmit filter 64.

Processor 26 may represent one or more processors such as a baseband processor, an application processor, a digital signal processor, a microcontroller, a microprocessor, a central processing unit (CPU), a programmable device, a combination of these circuits, and/or one or more processors within circuitry 18. Processor 26 may be configured to generated digital (baseband) signals BB. Signals BB are sometimes referred to as baseband signals, digital signals, or transmit signals. As examples, the digital signals generated by processor 26 may include in-phase (I) and quadrature-phase (Q) signals, radius and phase signals, or other digitally-coded signals. The baseband signals BB may at some point be converted from the digital domain into the analog domain using one or more digital-to-analog converters and then upconverted, using upconverter 62 (e.g., a radio-frequency mixer), from the baseband frequency range (which is typically in the range of a couple hundred to a couple thousand Hz) to radio frequencies in the range of hundreds of MHz or in the GHz range.

The upconverted radio-frequency signals may be fed as an input (see Rf_in port) to amplifier 50. In the example of FIG. 3, amplifier 50 may include an input transistor 74, an inductor 76, and a capacitor 78. Input transistor 74 may be an n-type bipolar junction (BJT) transistor 74 having a base terminal coupled to the amplifier input port Rf_in, an emitter terminal coupled to a ground power supply line 75 (sometimes referred to as a ground line or ground), and a collector terminal coupled to node 77. Inductor 76 may have a first terminal coupled to node 77 and a second terminal configured to receive a positive power supply voltage Vcc. Capacitor 78 may have a first terminal coupled to node 77 and a second terminal coupled to transmit filter 64. Ideally, node 77 should be kept at a voltage level that keeps transistor 74 in constant compression (voltage swing) to maintain optimal efficiency.

Amplifier 50 of FIG. 3 showing only three components 74, 76, and 78 is merely illustrative and is not intended to limit the scope of the present embodiments. Transistor 74 merely represents at least one input transistor within amplifier 50 and can be implemented using any type of transistor devices (e.g., n-type or p-type BJT or metal-oxide-semiconductor transistor). Inductor 76 merely represents a load component that can receive power supply voltage Vcc. Capacitor 78 merely represents an output coupling component. If desired, amplifier 50 may be a differential amplifier or pseudo-differential amplifier may include additional cascode, common source, and/or common gate stages, may include cross-coupled transistors or capacitors, may include additional transistors, inductors, capacitors, and/or resistors, may include current mirrors, or other suitable amplifier components.

The output of amplifier 50 may be coupled to antenna 42 via one or more components such as a transmit filter 64. Transmit filter 64 may be a high-Q radio-frequency bandpass filter (e.g., based on surface acoustic wave or bulk acoustic wave filter technology). Such types of radio-frequency filters oftentimes present a load impedance seen by amplifier 50 in the direction of arrow 65 that varies as a function of frequency. This frequency dependent load impedance Z (f) is also equivalent to the input impedance of transmit filter 64. Load impedance Z (f) is sometimes referred to herein as the frequency dependent amplifier load. A frequency dependent amplifier load impedance causes different tones (e.g., signals at different frequencies) to see a different input impedance of transmit filter 64. In such scenarios, the radio-frequency voltage response of the tones will have non-linear distortions and have different phase and amplitude, and the resulting envelope at the collector node 77 will not be well captured by a simple envelope of the baseband signals. In other words, conventional envelope tracking techniques would not be able to maintain the amplifier in conditions according to the desired gain or compression strategy (i.e., the compression and the amplifier gain will change undesirably over time and become signal history dependent, thus degrading the overall performance of the power amplifier).

To help mitigate such effects of the frequency dependent amplifier load, wireless circuitry 24 may be provided with circuits configured to produce a control signal that is used to dynamically tune amplifier 50 to offset any frequency dependent response of filter 64. Still referring to FIG. 3, wireless circuitry 24 may further include an amplifier load response estimation circuit such as amplifier load response estimator 66, a non-linearity estimation circuit such as amplifier non-linearity estimator 68, and a control signal generation circuit such as control signal generator 71.

Amplifier load response estimator 66 may be configured to estimate the frequency dependent load response Z(f) of filter 64. Since amplifier load response estimator 66 receives and acts on the baseband signals, it is implemented as a complex-valued baseband model that is an exact replica or an approximation (resemblance) of the radio-frequency filter response. In other words, estimator 66 implements a baseband filter model that replicates or approximates (resembles) the input impedance of the radio-frequency transmit filter 64. Such baseband filter model will shape the baseband signals in the same way that the transmit filter 64 will subsequently with the corresponding radio-frequency signals. The baseband filter model can replicate the signal processing of filter 64 in various ways. It can differ in order and accuracy from the TX filter 64 (e.g., it can model only the most dominant effects of the filter). The filter dynamic of the baseband filter model can be implemented in a similar structure as suggested by the physical implementation of the TX filter itself. The filter dynamics can be implemented also in an abstract way which differs from filter structure and order from the TX filter, but which creates sufficiently deep memory to capture the dominant memory components of the TX filter. The baseband model can be a digital model or an analog model. Amplifier load response estimator 66 may be run (executed) on or implemented using processing circuitry 18 (see FIG. 1) or other processing circuitry within wireless circuitry 24.

Figure 5A:
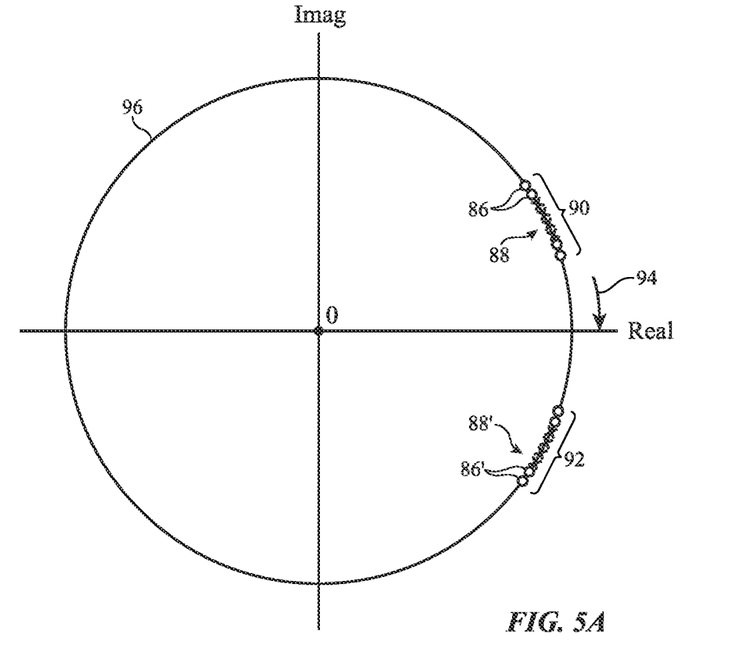
FIG. 5A is a pole-zero diagram of an illustrative bandpass filter configured to pass radio-frequency signals in accordance with some embodiments.

The baseband model may be derived from the radio-frequency response of the frequency dependent load. As described above, the baseband model may be an exact baseband representation or an approximate baseband representation of the frequency dependent load. FIG. 5A is a pole-zero diagram of an illustrative frequency response of radio-frequency transmit filter 64. In general, a filter's response can be represented by the location of its poles and zeroes in a complex plane. As shown in FIG. 5A, radio-frequency transmit filter 64 exhibits a first group of zeroes 86 and poles 88 (see group 90) in a first region along unit circle 96 in a complex plane and exhibits a second group of zeroes 86' and poles 88' (see group 92) in a second region along unit circle 96 in the complex plane. For example, group 90 may include zeroes and poles at around a positive radio frequency such as 2 GHz, whereas group 92 may include zeroes and poles at around a negative radio frequency such as −2 GHz.

Figure 5B:
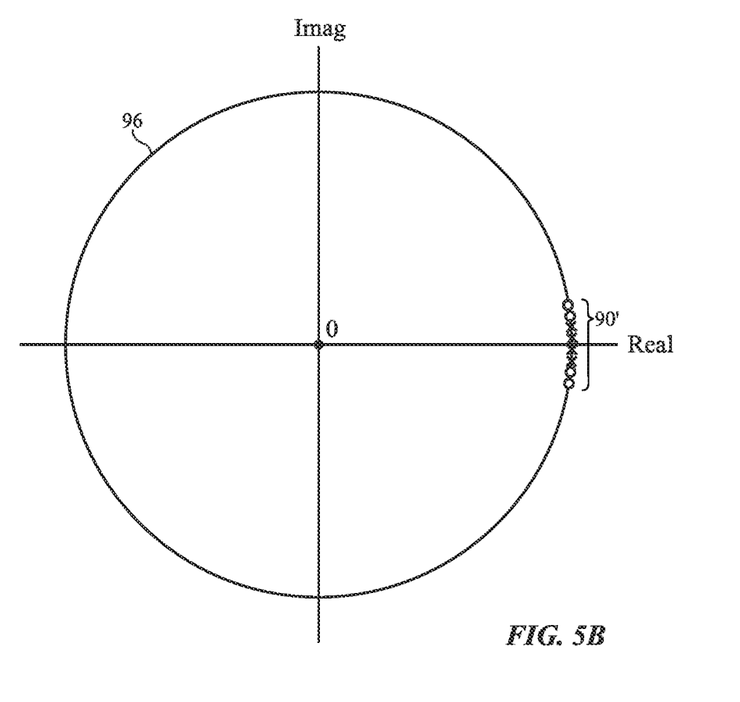
FIG. 5B is a pole-zero diagram of a complex baseband filter model generated based on the bandpass filter response shown in FIG. 5A in accordance with some embodiments.

At least some of the zeroes and poles in FIG. 5A may be used to obtain a corresponding baseband version of the transmit filter response (see, e.g., FIG. 5B). Some variation between zeroes and poles of the transmit filter response and the baseband model is permitted (i.e., an exact match is not required, and a slight deviation would still be sufficient to provide the required predistortion). FIG. 5B is a pole-zero diagram of the baseband filter response of load estimator 66. To create the baseband model of FIG. 5B, group 92 at the negative coordinates may be completely removed, whereas at least some of the zeroes 86 and poles 88 in group 90 are mixed down to baseband in the direction shown by arrow 94 (see, e.g., downconverted group of poles and zeroes 90'). This illustrates merely one way of creating a baseband model of a filter circuit. As another example, a baseband model may be created by first determining the order of radio-frequency filter 64, locating the poles and zeroes of filter 64, and then generating a baseband model having the same order and based on the pole and zero locations. If desired, other ways of obtaining an exact or approximate baseband model derived from or based on the frequency dependent amplifier load can be employed.

Referring back to FIG. 3 amplifier load response estimator 66 may receive the baseband signals and generate a corresponding estimated load response (sometimes referred to as the estimated filter response) using the frequency dependent baseband model. Amplifier non-linearity estimator 68 may receive the estimated load response from the output of amplifier load response estimator 66. Amplifier non-linearity estimator 68 may be an optional block that implements a non-linear shaping function that distorts the output of estimator 66. Amplifier non-linearity estimator 68 may, for example, mimic or model any non-linear behavior associated with input transistor 74 or other non-linear components within amplifier 50. Configured in this way, amplifier non-linearity estimator 68 may generate estimated amplifier non-linear amplitude and phase information at its output. If desired, non-linearity estimator 68 may also capture non-linear effects introduced by the frequency dependent load. Estimator block 68 may therefore sometimes be referred to more broadly as an amplifier and load non-linearity estimator. Amplifier non-linearity estimator 68 may be executed on or implemented using processing circuitry 18 (see FIG. 1) or other processing circuitry within wireless circuitry 24.

Control signal generator 71 may receive the estimated amplifier non-linear amplitude and phase information from estimator 68 or may receive the estimated load response directly from estimator 66 (if block 68 were to be omitted). Control signal generator 71 may include an absolute function generator 70 and an envelope tracking power management circuit 72. Absolute function generator 70 may apply the absolute value function to its input. The envelope tracking power management circuit 72 receives signals output from the absolute function generator 70 and performs an envelope tracking mapping (and/or scaling) function which translates the received absolute value into an envelope tracking supply voltage Vcc that is used to power radio-frequency amplifier 50. Control signal generator 71 operated in this way is therefore sometimes referred to as an envelope generator. If desired, control signal generator 71 may further include additional blocks that are used to generate an input signal to the envelope tracking power management circuit 72. For example, control signal generator 71 may further include a signal shaping lookup table (LUT) to implement LUT-based shaping functions, linear signal processing blocks to implement linear shaping functions, non-linear signal processing blocks to implement (for example) polynomial shaping functions, equalization blocks, delay adjustment circuits, signal bypass circuitry, dynamic gain adaptation circuitry, compensation circuitry such as temperature compensation circuit, digital-to-analog converters, a combination of these circuits, and/or other signal conditioning circuits. In some embodiments, control signal generator 71 may be implemented using processing circuitry 18 (see FIG. 1) or other processing circuitry within wireless circuitry 24.

Figure 4:
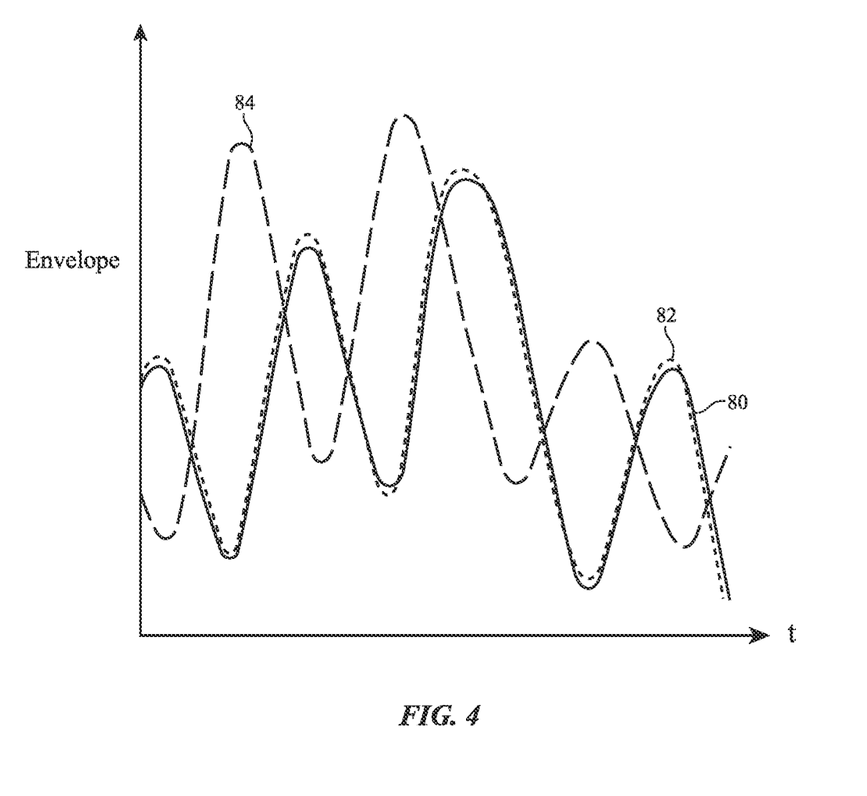
FIG. 4 is a plot showing how envelope tracking predistortion can accurately predict the actual radio-frequency envelope seen at the output of an amplifier to achieve frequency dependent envelop tracking in accordance with some embodiments.

FIG. 4 is a plot showing how the envelope tracked supply voltage Vcc generated using amplifier load response estimator 66 and optionally amplifier non-linearity estimator 68 can achieve frequency dependent envelop tracking/shaping. In FIG. 4, curve 80 represents the actual radio-frequency envelope at the collector node 77, curve 82 represents the predicted (or pre-distorted) envelope output from control signal generator 71, and curve 84 represents the original envelope of the baseband signals BB prior to upconversion. In order for amplifier 50 to be in constant compression, the supply voltage Vcc needs to be able to track the voltage at the collector terminal 77. As shown in FIG. 4, while the original baseband curve 84 deviates from target radio-frequency curve 80 even if it was time aligned, the predicted envelope curve 82 very closely tracks the target curve 80. In other words, voltage Vcc generated in this way is able to closely track the radio-frequency envelope even in the presence of a frequency dependent amplifier load Z(f). As a result, amplifier 50 can be kept in constant compression without generating any unwanted distortion products and while improving the overall linearity.

Amplifier load response estimator 66 and amplifier non-linearity estimator 68 operated in this way are sometimes referred to collectively as envelope tracking (ET) predistortion circuitry. The control signal generator is sometimes also considered to be part of the predistortion circuitry. The load response estimator 66 provides a much better estimate of the RF envelope which occurs inside amplifier 50 than if the control signal was derived from the baseband signal directly and without considering the frequency dependent effects such as solely using an absolute value function on baseband IQ signals. The use of load response estimator 66 enables control signal generator 71 to provide a more accurate control signal for adjusting amplifier 50 according to its operating and bias conditions, especially to the instantaneous voltage which occurs at the interface between amplifier 50 and filter 64.

Figure 6:
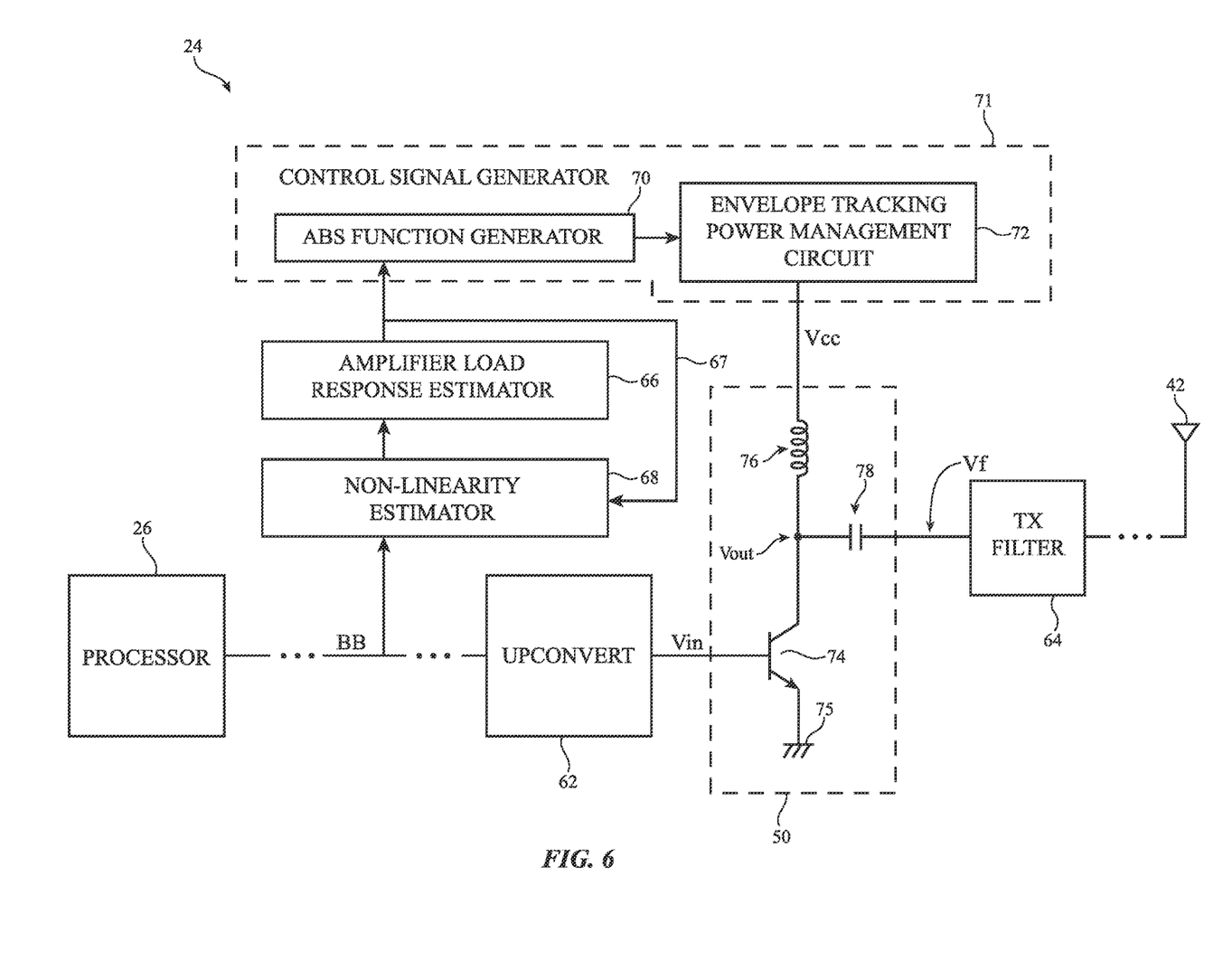
FIG. 6 is a diagram of illustrative wireless circuitry having envelope tracking predistortion circuitry with feedback that is configured to generate a variable power supply voltage for an amplifier in accordance with some embodiments.

The example of FIG. 3 in which the amplifier load response estimator 66 precedes the amplifier non-linearity estimator 68 is merely illustrative. FIG. 6 illustrates another embodiment of wireless circuitry 24 with envelope tracking predistortion circuitry having amplifier non-linearity estimator 68 that precedes the amplifier load response estimator 66. In practice, there may be non-linear distortion current that is generated within amplifier 50. For example, consider a voltage signal Vin at the base terminal of transistor 74. Amplifier 50 and frequency dependent load will generate a corresponding voltage signal Vout at its collector terminal. The current at the collector terminal may be a function of Vin and Vout. Voltage signal Vout may be a function of supply voltage Vcc and the voltage at the input of the load (see, e.g., voltage Vf at the input of transmit filter 64). Voltage Vf may be a function of load impedance Z(f) and is therefore a frequency dependent signal. In other words, the voltage Vf at the input of the filter effectively feeds back to affect the collector voltage Vout, which changes the current flowing through transistor 74 (e.g., the non-linear distortion current is converted via the frequency dependent impedance Z(f) into voltage, which is fed back to the non-linear input transistor).

In other words, there can be some feedback from block 66 back into block 68 (i.e., the non-linearity estimator 68 should also consider the output from the baseband filter model). The order of the estimation steps can vary with implementation. In the example of FIG. 6, the estimated load response output from block 66 can be fed back as an input to non-linearity estimator block via feedback path 67. As shown in FIG. 6, amplifier non-linearity estimator 68 may receive the baseband signals and generate a corresponding estimated amplifier non-linear amplitude and phase information. Amplifier non-linearity estimator 68 may implement a non-linear shaping function that mimics or models any non-linear behavior associated with input transistor 74 or other non-linear components within amplifier 50. Amplifier load response estimator 66 may receive the estimated amplifier non-linear amplitude and phase information (sometimes referred to as estimated amplifier non-linearity terms) from the output of estimator block 68 and generate a corresponding estimated load response using a frequency dependent baseband model that emulates the behavior of the power amplifier load (e.g., that mimics the frequency dependent input impedance of bandpass filter 64). The estimated load response may be fed back as an input to estimator block 68 via loopback path 67 to model the behavior of the non-linear distortion current in amplifier 50. Anticipating the amplifier non-linear terms further improves the envelope tracking capabilities of the ET predistortion circuitry, which can enable envelope tracking at high frequencies not previously possible.

Control signal generator 71 may receive the estimated load response from estimator 66. Control signal generator 71 may include an absolute function generator 70 and an envelope tracking power management circuit 72. Absolute function generator 70 may apply the absolute value function to its input. The envelope tracking power management circuit 72 receives signals output from the absolute function generator 70 and performs an envelope tracking mapping (and/or scaling) function, which translates the received absolute value into an envelope tracking supply voltage Vcc that is used to power radio-frequency amplifier 50. Configured and operated in this way, amplifier 50 can be kept in constant compression (e.g., a constant radio-frequency peak voltage can be maintained at the amplifier) without generating any unwanted distortion products and while improving the overall linearity.

The embodiments of FIGS. 3 and 6 in which the predistortion circuitry (e.g., the amplifier load response estimator 66 and the amplifier non-linearity estimator 68) is used to generate an envelope tracking power supply voltage Vcc is merely illustrative. In another example, the predistortion circuitry can be used to generate an adjustable bias voltage for amplifier 50.

Figure 7:
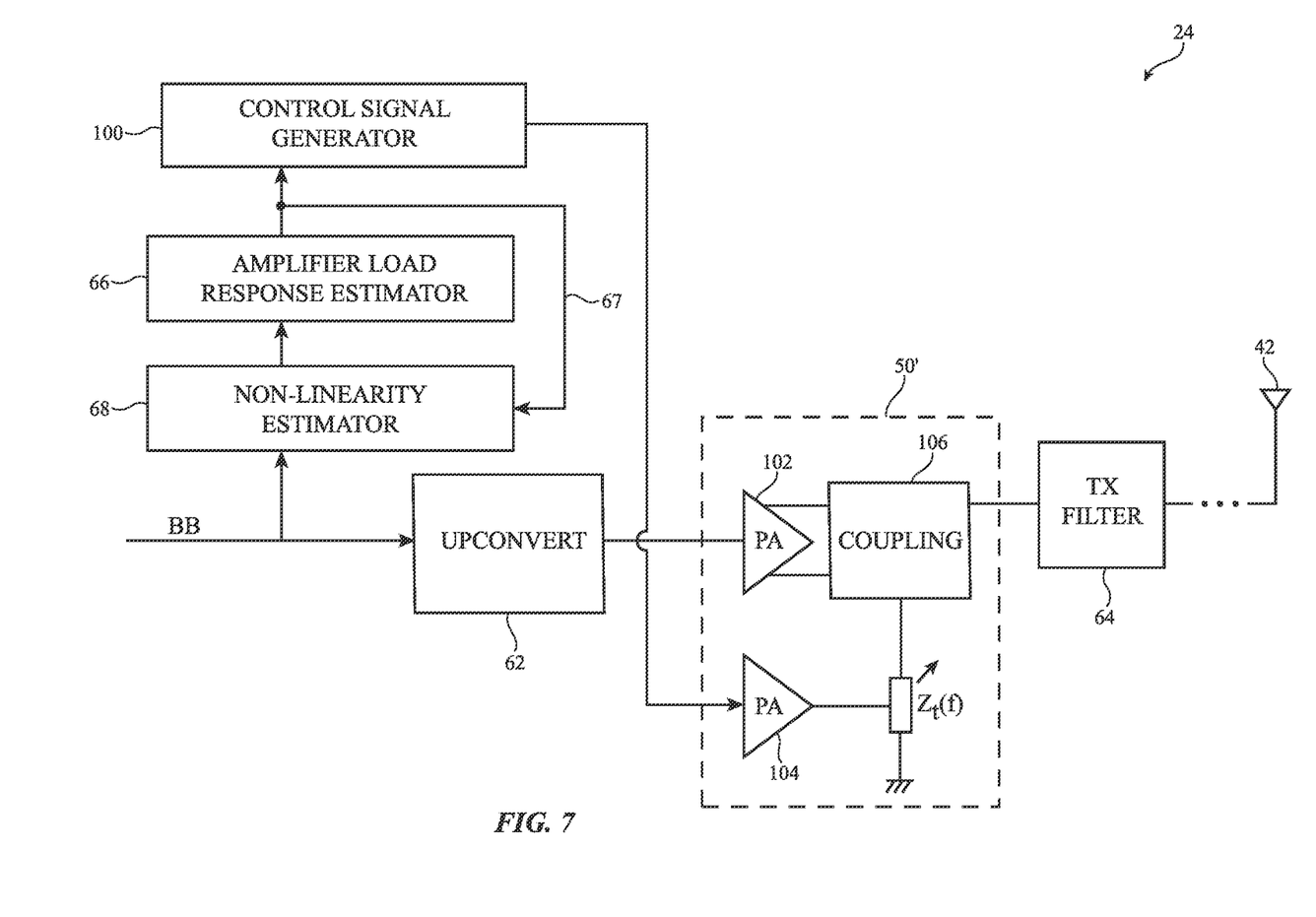
FIGS. 7 and 8 are diagrams of illustrative wireless circuitry having an amplifier coupled to an adjustable load component in accordance with some embodiments.

FIG. 7 shows another embodiment in which the radio-frequency power amplifier is a load modulated amplifier 50' where instead of the amplifier being tuned via the power supply voltage, amplifier 50' is tuned via an adjustable load component. As shown in FIG. 7, amplifier non-linearity estimator 68 may receive the baseband signals and generate corresponding estimated amplifier non-linearity terms. Amplifier non-linearity estimator 68 may implement a non-linear shaping function that mimics or models any non-linear behavior associated one or more non-linear components within amplifier 50. If desired, non-linearity estimator block 68 and feedback path 67 can optionally be omitted.

Amplifier load response estimator 66 may receive the estimated amplifier non-linearity terms from the output of estimator block 68 and generate a corresponding estimated load response using a frequency dependent baseband model that emulates the behavior of the power amplifier load (e.g., that mimics or approximates the frequency dependent input impedance of transmit filter 64). The estimated load response may be fed back as an input to estimator block 68 via loopback path 67 to model the behavior of the non-linear distortion current in amplifier 50 and to model any non-linear behavior associated with filter 64. Anticipating these non-linear terms further improves the predictive accuracy of the predistortion circuitry.

Control signal generator 100 may receive the estimated load response from estimator 66. Control signal generator 100 may include an absolute value function generator (and optionally a signal shaping function), a linear or non-linear transformation function, a combination of these functions, or other signal conditioning function for outputting an amplifier control signal. In some embodiments, control signal generator 100 may be implemented using processing circuitry 18 (see FIG. 1) or other processing circuitry within wireless circuitry 24. Load modulated amplifier 50' may include a primary (main) amplifier 102 in the main signal path and an auxiliary amplifier 104 configured to tune the adjustable load component of amplifier 50'. Amplifier 102 may have an input configured to receive radio-frequency signals from upconversion circuit 62 and an output coupled to an adjustable load component. Auxiliary amplifier 104 may have an input configured to receive the control signal from the output of control signal generator 100 and may have an output coupled to the adjustable load component.

The adjustable load component is disposed at the output of amplifier 50' and includes a coupling circuit 106 and an adjustable impedance Zt(f). Adjustable impedance Zt(f) may be an adjustable resistance, an adjustable capacitance, an adjustable inductance, a combination of these adjustable components, or other adjustable component. Adjustable impedance Zt(f) may vary as a function of frequency (as an example). Coupling circuit 106 may have an input coupled to the output of amplifier 50', may be coupled to adjustable impedance Zt(f), and may have an output coupled to filter 64. Configured in this way, auxiliary amplifier 104 can adjust impedance Zt(f) as a function of frequency to mitigate or offset any frequency dependent behavior of filter 64. As a result, the peak radio-frequency voltage in amplifier 50' can be kept constant to maintain compression and iso-gain operation (if desired).

Figure 8:
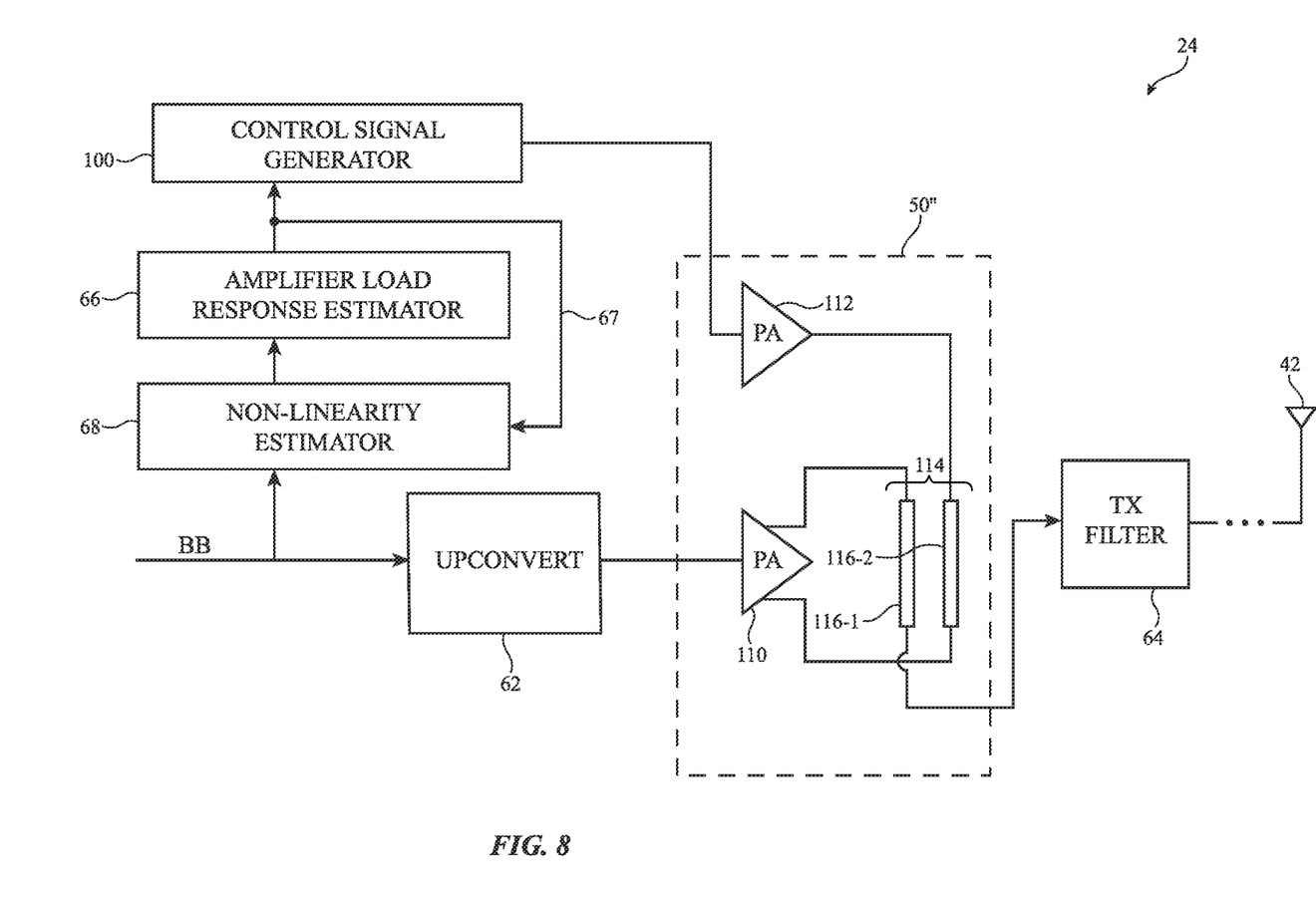

The example of FIG. 7 in which the adjustable load component has an adjustable frequency dependent impedance Zt(f) is merely illustrative. FIG. 8 shows another embodiment of load modulated radio-frequency power amplifier 50" in which the adjustable load component is a radio-frequency coupler. In general, any type of load modulated power amplifier can be used for the radio frequency system described herein. This may include Doherty type amplifiers, load modulated balanced power amplifiers, or the like. As shown in FIG. 8, amplifier non-linearity estimator 68 may receive the baseband signals and generate corresponding estimated amplifier non-linearity terms. Amplifier non-linearity estimator 68 may implement a non-linear shaping function that mimics or models any non-linear behavior associated one or more non-linear components within amplifier 50. If desired, non-linearity estimator block 68 and feedback path 67 are optional and can be omitted.

Amplifier load response estimator 66 may receive the estimated amplifier non-linearity terms from the output of estimator block 68 and generate a corresponding estimated load response using a frequency dependent baseband model that emulates the behavior of the power amplifier load (e.g., that replicates the frequency dependent input impedance of transmit filter 64). The estimated load response may be fed back as an input to estimator block 68 via loopback path 67 to mimic the behavior of the non-linear distortion current in amplifier 50. Anticipating these non-linear terms further improves the predictive accuracy of the predistortion circuitry.

Control signal generator 100 may receive the estimated load response from estimator 66. Control signal generator 100 may be an absolute value function generator, a signal shaping function, a linear or non-linear transformation function, a combination of these functions, or other signal conditioning function for outputting an amplifier control signal. Load modulated amplifier 50" may include a primary (main) amplifier 110 in the main signal path and an auxiliary amplifier 112 configured to tune the adjustable load component of amplifier 50" (e.g., to tune a radio-frequency coupler 114). Amplifier 110 may have an input configured to receive radio-frequency signals from upconversion circuit 62 and an output coupled to radio-frequency coupler 114. Auxiliary amplifier 112 may have an input configured to receive the control signal from the output of control signal generator 100 and may have an output coupled to radio-frequency coupler 114.

Radio-frequency coupler 114 may be disposed at the output of primary amplifier 110. Radio-frequency coupler 114 may include a first coupling component having a first terminal coupled to the output of amplifier 110 and having a second terminal coupled to filter 64 and may further include a second coupling component having a first terminal coupled to the output of amplifier 110 and having a second terminal coupled to the output of auxiliary amplifier 112. Configured in this way, auxiliary amplifier 112 can adjust the load coupling at the output of amplifier 110 as a function of frequency to mitigate or offset any frequency dependent behavior of filter 64. As a result, the peak radio-frequency voltage in amplifier 50' can be kept constant to maintain compression and iso-gain operation (if desired).

The examples of FIGS. 3, 6, 7, and 8 in which power amplifier 50 represents one amplifier is merely illustrative and is not intended to limit the scope of the present embodiments. In general, amplifier 50 may represent an array of radio-frequency power amplifiers that are, for example, used in millimeter wave applications. In such arrangements, the frequency dependent load may be a multiport component having multiple input ports connected to different amplifiers in the array. Each power amplifier in the array may see a signal/impedance at that input port of the multiport component. The impedance of each input port may depend on its own signal and its own signal history but also on the signal and signal history of other power amplifiers connected to that multiport component. To model this, the load response estimator may implement a multidimensional model that models different sets of load responses for each port. The set of load responses along with a set of non-linear models of the non-linear estimation block can then be used to generate a set of control signals for controlling one or more of the amplifiers in the array.

The methods and operations described above in connection with FIGS. 1-8 may be performed by the components of device 10 using software, firmware, and/or hardware (e.g., dedicated circuitry or hardware). Software code for performing these operations may be stored on non-transitory computer readable storage media (e.g., tangible computer readable storage media) stored on one or more of the components of device 10 (e.g., storage circuitry 16 and/or wireless communications circuitry 24 of FIG. 1). The software code may sometimes be referred to as software, data, instructions, program instructions, or code. The non-transitory computer readable storage media may include drives, non-volatile memory such as non-volatile random-access memory (NVRAM), removable flash drives or other removable media, other types of random-access memory, etc. Software stored on the non-transitory computer readable storage media may be executed by processing circuitry on one or more of the components of device 10 (e.g., processing circuitry in wireless circuitry 24, processing circuitry 18 of FIG. 1, etc.). The processing circuitry may include microprocessors, application processors, digital signal processors, central processing units (CPUs), application-specific integrated circuits with processing circuitry, or other processing circuitry.

The foregoing is merely illustrative and various modifications can be made to the described embodiments. The foregoing embodiments may be implemented individually or in any combination.

What is claimed is:

1. Wireless circuitry comprising:
   a frequency upconversion circuit having an input configured to receive baseband signals and having an output on which corresponding radio-frequency signals are generated;
   an amplifier having an input configured to receive the radio-frequency signals from the output of the frequency upconversion circuit;
   a load response estimator having an input configured to receive signals generated based on the baseband signals and having an output on which an estimated load response is generated, the load response estimator implementing a baseband model derived from a frequency dependent load impedance seen at an output of the amplifier; and
   a control signal generator having an input configured to receive the estimated load response from the output of the load response estimator and having an output coupled to a control input of amplifier.

2. The wireless circuitry of claim 1, wherein the control signal generator comprises:
   an absolute value function generator having an input configured to receive the estimated load response from the output of the load response estimator and having an output; and
   an envelope tracking power management circuit having an input coupled to the output of the absolute value function generator and having an output coupled to the control input of the amplifier, an adjustable power supply voltage being provided to the control input of the amplifier using the envelope tracking power management circuit.

3. The wireless circuitry of claim 1, wherein the control signal generator comprises an absolute value function generator configured to receive the estimated load response from the output of the load response estimator and that is used to generate a bias signal to the control input of the amplifier.

4. The wireless circuitry of claim 1, wherein the control signal generator comprises an envelope tracking power management circuit configured to generate an envelope tracking power supply voltage to the control input of the amplifier.

5. The wireless circuitry of claim 1, further comprising:
   a non-linearity estimator having an input configured to receive the baseband signals and having an output on which non-linearity information is generated, the non-linearity information being fed to the input of the load response estimator.

6. The wireless circuitry of claim 5, wherein the load response estimator and the non-linearity estimator are implemented using processing circuitry.

7. The wireless circuitry of claim 1, further comprising a bandpass filter having an input impedance equal to the frequency dependent load impedance seen at the output of the amplifier.

8. The wireless circuitry of claim 1, further comprising:
   a non-linearity estimator coupled between the output of the load response estimator and the input of the control signal generator, the non-linearity estimator being configured to estimate non-linearity effects associated with the amplifier and being implemented using processing circuitry.

9. The wireless circuitry of claim 1, wherein the amplifier comprises:
   a primary amplifier having an input configured to receive the radio-frequency signals from the output of the frequency upconversion circuit; and
   an auxiliary amplifier having an input configured to receive the control signal from the control signal generator.

10. The wireless circuitry of claim 9, further comprising:
    a coupling circuit coupled to the output of the primary amplifier and coupled to an adjustable impedance that is controlled by the auxiliary amplifier.

11. The wireless circuitry of claim 9, further comprising a radio-frequency coupler that includes:
    a first coupling component having a first terminal coupled to an output of the primary amplifier and having a second terminal coupled to a transmit filter exhibiting the frequency dependent load impedance; and
    a second coupling component paired with the first coupling component, the second coupling component having a first terminal coupled to the output of the primary amplifier and having a second terminal coupled to an output of the auxiliary amplifier.

12. A method of operating wireless circuitry, comprising:
    upconverting baseband signals to radio-frequency signals;
    with an amplifier, receiving and amplifying the radio-frequency signals, the amplifier having an output coupled to a frequency dependent load;
    with an amplifier load response estimator, generating an estimated amplifier load response based on the baseband signals, the amplifier load response estimator implementing a baseband model obtained from the frequency dependent load; and
    with a control signal generator, generating a control signal for the amplifier based on the estimated amplifier load response.

13. The method of claim 12, wherein generating the control signal for the amplifier comprises generating an adjustable power supply voltage for the amplifier based on the estimated amplifier load response.

14. The method of claim 12, wherein generating the control signal for the amplifier comprises generating an adjustable bias voltage for the amplifier based on the estimated amplifier load response.

15. The method of claim 12, wherein generating the control signal for the amplifier comprises generating a load modulation control signal for the amplifier based on the estimated amplifier load response.

16. The method of claim 12, wherein generating the control signal for the amplifier comprises generating an input signal to an auxiliary amplifier coupled to the amplifier.

17. An electronic device comprising:
one or more processors configured to generate baseband signals;
an upconverter configured to upconvert the baseband signals to radio-frequency signals;
an amplifier having an input configured to receive the radio-frequency signals from an output of the upconverter;
a bandpass filter coupled at an output of the amplifier, the bandpass filter having a frequency dependent input impedance; and
predistortion circuitry configured to receive the baseband signals, to predistort the baseband signals using a baseband model that resembles the frequency dependent input impedance of the bandpass filter, and to generate a corresponding control signal for adjusting the amplifier.

18. The electronic device of claim 17, wherein the predistortion circuitry comprises:
a load response estimator implementing the baseband model; and
a non-linearity estimator configured to model a non-linear behavior associated with the amplifier and non-linear effects associated with the bandpass filter, wherein the load response estimator and the non-linearity estimator are executed on processing circuitry within the electronic device.

19. The electronic device of claim 17, wherein the control signal comprises a signal selected from the group consisting of: an adjustable power supply voltage for the amplifier, an adjustable bias voltage for the amplifier, a load modulation control signal for the amplifier, and an input signal to an auxiliary amplifier coupled to the amplifier.

20. The electronic device of claim 17, wherein the predistortion circuitry comprises an envelope generator configured to generate the control signal for adjusting the amplifier.

* * * * *